United States Patent
Dede (10) Patent No.: US 11,081,422 B2
(45) Date of Patent: Aug. 3, 2021

(54) SELF-HEALING PDMS ENCAPSULATION AND REPAIR OF POWER MODULES

(71) Applicant: Toyota Motor Engineering & Manufacturing North America, Inc., Plano, TX (US)

(72) Inventor: Ercan Mehmet Dede, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 72 days.

(21) Appl. No.: 16/353,201

(22) Filed: Mar. 14, 2019

(65) Prior Publication Data

US 2020/0294883 A1 Sep. 17, 2020

(51) Int. Cl.
*H01L 23/28* (2006.01)
*H01L 23/373* (2006.01)
(Continued)

(52) U.S. Cl.
CPC ........ *H01L 23/3737* (2013.01); *H01L 23/295* (2013.01); *H01L 23/3107* (2013.01);
(Continued)

(58) Field of Classification Search
CPC .. H01L 23/3107; H01L 23/60; H01L 27/0251
(Continued)

(56) References Cited

U.S. PATENT DOCUMENTS

| 7,256,431 B2 * | 8/2007 | Okamoto | C23C 28/345 257/177 |
| 7,449,726 B2 * | 11/2008 | Nakanishi | H01L 24/73 257/177 |

(Continued)

OTHER PUBLICATIONS

Wu, X. et al., "Heat-triggered poly(siloxane-urethane)s based on disulfide bonds for self-healing application", J. Appl. Polym. Sci. 2018, vol. 135, Abstract and supporting information only, 4 pages.
(Continued)

*Primary Examiner* — Nitin Parekh
(74) *Attorney, Agent, or Firm* — Christopher G. Darrow; Darrow Mustafa PC (57) ABSTRACT

A power electronics assembly is provided with a self-healing feature. The power electronics assembly may include a semiconductor electronics device and an insulating substrate coupled to the semiconductor electronics device. A base metal structural component may be provided, coupled to the insulating substrate. The assembly may include a frame component cooperating with the base metal structural component and defining an enclosure containing the semiconductor electronics device and the insulating substrate. The assembly further includes a self-healing polymer comprising disulfide bonds. The self-healing polymer is disposed within the enclosure; additional potting material may also be provided as a multi-layered encapsulation. In various aspects, the self-healing polymer may include polydimethylsiloxane based polyurethane (PDMS-PU) modified with disulfide bonds. The frame component may be configured to direct or confine heat to areas of the assembly where ESD may be problematic.

12 Claims, 10 Drawing Sheets

(51) Int. Cl.
    *H01L 23/31*     (2006.01)
    *H01L 27/02*     (2006.01)
    *H01L 23/60*     (2006.01)
    *H01L 23/532*     (2006.01)
    *H01L 23/29*     (2006.01)

(52) U.S. Cl.
    CPC ........ *H01L 23/53209* (2013.01); *H01L 23/60* (2013.01); *H01L 27/0251* (2013.01)

(58) Field of Classification Search
    USPC .................. 257/790, 678, 666, 713, 675
    See application file for complete search history.

(56) References Cited

U.S. PATENT DOCUMENTS

| | | | |
|---|---|---|---|
| 9,123,639 | B2 | 9/2015 | Kimijima et al. |
| 2002/0020923 | A1* | 2/2002 | Kanatake ................ H01L 21/56 257/778 |
| 2003/0022464 | A1* | 1/2003 | Hirano .................. H01L 21/565 438/460 |
| 2013/0009298 | A1* | 1/2013 | Ota ..................... H01L 23/3735 257/676 |
| 2013/0175678 | A1* | 7/2013 | Ide ...................... H01L 23/4334 257/675 |
| 2017/0338176 | A1* | 11/2017 | Tsuyuno ................. H01L 25/07 |
| 2019/0181125 | A1* | 6/2019 | Cho .................... H01L 23/4334 |

OTHER PUBLICATIONS

Canadell, J. et al., "Self-Healing Materials Based on Disulfide Links," Macromolecules, 2011, 44 (8), Abstract only, 2 pages.

Product Description for Self Healing Liquid Silicone Gel Compounds for IGBT Potting, Hunan LEED Electronic Ink Co., Ltd. (LEED-INK) last downloaded from website on Nov. 21, 2018, 9 pages.

Fabian, J.-H. et al., "Analysis of insulation failure modes in high power IGBT modules," IEEE, Fourtieth IAS Annual Meeting, Conference Record of the 2005 Industry Applications Conference, 2005, pp. 799-805.

\* cited by examiner

SELF-HEALING PDMS ENCAPSULATION AND REPAIR OF POWER MODULES

TECHNICAL FIELD

The present disclosure generally relates to substrates for use with electronic components and, more particularly, to self-healing materials and structures to repair damage related to electrostatic discharge (ESD) with semiconductor electronics devices such as electronic power modules.

BACKGROUND

The background description provided herein is for the purpose of generally presenting the context of the disclosure. Work of the presently named inventors, to the extent it may be described in this background section, as well as aspects of the description that may not otherwise qualify as prior art at the time of filing, are neither expressly nor impliedly admitted as prior art against the present technology.

Quality electronic components should exhibit dynamic durability and provide reliable mechanical support as well as electrical insulation in changing environments. Support structures and bonding materials used with semiconductor assemblies may be subjected to mechanical and/or thermal stresses as a result of temperature cycling. These mechanical and/or thermal stresses may cause conventional support structures, metal structures, and bonding materials to prematurely crack or fracture, which can lead to detrimental conditions ranging from reduced functionality to a complete failure of devices and/or components.

Electrostatic discharge (ESD) can be a major source of damage, and even failure, with discrete electronic devices such as metal oxide semiconductor field effect transistors (MOSFETs) and integrated gate bipolar transistors (IGBTs). High voltage electronics may be susceptible to partial discharge failures. Typically, silicone may be used as standard dielectric gel insulation. However, erosion of internal areas by voids can initiate a runaway breakdown process.

Accordingly, it would be desirable to provide improved and cost effective power electronics assemblies that preserve the integrity and performance of electronic components, while also maintaining superior properties.

SUMMARY

This section provides a general summary of the disclosure, and is not a comprehensive disclosure of its full scope or all of its features.

In various aspects, the present teachings provide a power electronics assembly with a self-healing feature. The power electronics assembly may include a semiconductor electronics device and an insulating substrate coupled to the semiconductor electronics device. A base metal structural component may be provided, coupled to the insulating substrate. The assembly includes a frame component cooperating with the base metal structural component and defining an enclosure containing the semiconductor electronics device and the insulating substrate. The assembly may further include a self-healing polymer comprising disulfide bonds. The self-healing polymer is disposed within the enclosure. In various aspects, the self-healing polymer may include polydimethylsiloxane based polyurethane (PDMS-PU) modified with disulfide bonds. The frame component may be configured to confine heat to edge regions of the semiconductor electronics device where ESD may be problematic.

In other aspects, the present teachings provide a self-healing power module assembly with double sided cooling. The self-healing power module assembly includes a lower electrode and a semiconductor electronics device coupled to the lower electrode. A spacer component may be provided adjacent the semiconductor electronics device, and an upper electrode may be provided disposed adjacent to the spacer component. A frame component cooperates with the upper and lower electrodes to define an enclosure containing the semiconductor electronics device and the spacer component. A self-healing polymer comprising disulfide bonds may be provided within the enclosure. In various aspects, the self-healing polymer may include polydimethylsiloxane based polyurethane (PDMS-PU) modified with disulfide bonds.

In still other aspects, the present teachings provide a self-healing power card for a power stack of a power control unit. The self-healing power card may include a lower electrode and a semiconductor electronics device coupled to the lower electrode. A spacer component may be provided disposed adjacent to the semiconductor electronics device. An upper electrode is disposed adjacent to the spacer component. The power card includes a self-healing polymer comprising disulfide bonds. The self-healing polymer may encapsulate the lower electrode, the semiconductor electronics device, the spacer component, and the upper electrode. An external shell may be provided, encapsulating the self-healing polymer to provide a self-healing power card.

Further areas of applicability and various methods of enhancing the above technology will become apparent from the description provided herein. The description and specific examples in this summary are intended for purposes of illustration only and are not intended to limit the scope of the present disclosure.

BRIEF DESCRIPTION OF THE DRAWINGS

The present teachings will become more fully understood from the detailed description and the accompanying drawings, wherein.

It should be noted that the figures set forth herein are intended to exemplify the general characteristics of the methods, algorithms, and devices among those of the present technology, for the purpose of the description of certain aspects. These figures may not precisely reflect the characteristics of any given aspect, and are not necessarily intended to define or limit specific embodiments within the scope of this technology. Further, certain aspects may incorporate features from a combination of figures.

DETAILED DESCRIPTION

Self-healing techniques are useful in a variety of applications, ranging from flexible electronics to battery technology. The present technology is applicable in many of those applications, and may be particularly useful with materials in power electronics. In various aspects, the present technology generally provides for the use of a self-healing polymer having disulfide bonds, such as a modified polydimethylsiloxane (PDMS), as a self-healing insulating material to minimize and/or repair damage due to electrostatic discharge (ESD) related to the use of power electronics assemblies, electronic power modules, and the like. The self-healing PDMS may also be useful for filling voids that may form therein during the manufacturing process. In various aspects, the present technology may also redirect waste heat and/or confine heat to areas adjacent a power electronics device that may be more susceptible to ESD.

ESD can be a major source of damage and potential failure of discrete electronic devices, especially Metal Oxide Semiconductor Field Effect Transistors (MOSFETs) and Integrated Gate Bipolar Transistor (IGBTs), which are extremely sensitive to such discharges. High voltage electronics are susceptible to partial discharge failures. For example, partial discharges may occur in the gaseous contents of microscopic voids or spatial defects within the power device insulating material (e.g. silicone) when the electrical field exceeds a threshold value, which depends on the void/defect size and gas pressure. The discharges are said to be partial since they occur in a cavity of limited size in the insulating material and hence will not propagate in the material bulk. However, erosion of the internal surfaces of the void by high-energy ions and molecules produced in the discharges may be followed by the formation of a filamentary pattern of channels. This defect then acts as an electrical tree with repetitive discharges causing it to grow and possibly initiating a runaway breakdown process. As used herein, the term "spatial defect" includes any of a crack, fault, tear, cavity, fracture, separation, pore, deformation, imperfection, or similar defect in a crystalline or lattice structure of the insulating material component. The spatial defect may be fine or coarse, and may or may not be visibly detectable, but may still affect or impair at least one mechanical physical property of the material (for example, electrical conductivity, magnetic permeability, strength, density, plasticity, etc.). The spatial defect may begin at a point, and include a line, plane, or three dimensional shape.

PDMS is a silicon-based polymer with high flexibility, low usage temperature, excellent water resistance, outstanding electrical insulting property, and physiological inert, etc. As will be described herein, the present technology uses a PDMS-based polyurethane (PDMS-PU) modified with disulfide bonds as a self-healing polymer that exhibits reinforced thermal stability and excellent stretch-ability.

Typically, silicone is used as a standard dielectric gel insulation. Since PDMS-PU modified with disulfide bonds can heal itself with the application of heat, the present technology uses it to supplement and/or to completely replace silicone gel as the insulation filling in electronics devices. By utilizing a self-healing polymer with disulfide bonds, the heat generated by the semiconductor electronics device itself causes any ESD failures in the insulation filling to be self-healed as the device operates, and prevents the ESD failures from being propagated further.

Figure 1:
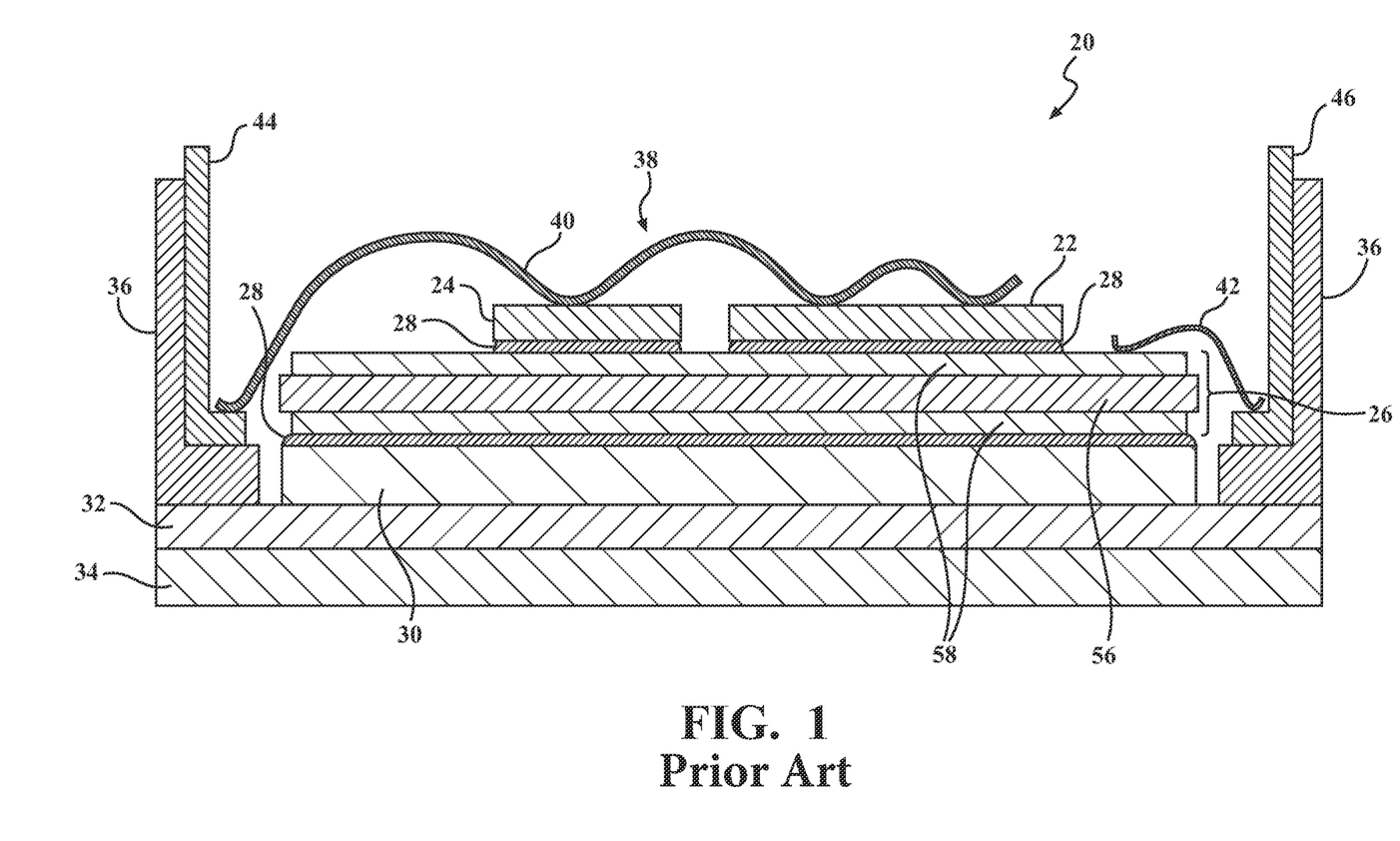
FIG. 1 is a schematic cross-sectional view of a conventional power module including a semiconductor electronics device.

FIG. 1 is a schematic cross-sectional view of a conventional power electronics assembly 20, or power module. This view of power electronics assembly 20 includes a semiconductor electronics device 22, a diode 24, and an insulating substrate 26 coupled to the semiconductor electronics device 22 and the diode 24, typically with a compatible solder or similar die attach 28.

As used herein, the broad term "semiconductor electronics device" is not meant to be limiting and can include various electronic circuits, integrated circuits, power semiconductors, and silicon-containing devices and chips as are known in the art. Generally, the semiconductor electronics device 22 can be any basic or discrete device for use in an electronic system used to affect electrons and/or their associated fields. The semiconductor electronics device 22 can also include any number of leads, lead wires, or electrical terminals; it can be active, passive, or electromagnetic. In various aspects, the semiconductor electronics device 22 may be an IGBT or MOSFET, as discussed herein, or a wideband gap (WBG) or ultra-wideband gap (UWBG) semiconductor widely used in hybrid, electric, and fuel cell vehicles. The semiconductor electronics device 22 can include various materials, including Si, GaAs, SiC, GaN, AlGaN, $Al_2O_3$, AlN, BN, diamond, and the like. Although shown as substantially rectangular components in the drawings, it should be understood that the semiconductor electronics device 22 and other diodes 24 may be provided with any shape, size, and dimensions suitable for the ultimate purpose and intended use.

The present technology provides a mechanism for self-healing, such that spatial defects that may occur in response to ESD or repeated mechanical and thermal stresses can be healed in a timely fashion, in many instances immediately upon their formation, in order to preserve the integrity and performance of the power electronics and their assemblies.

With renewed reference to FIG. 1, while only one of each is shown, several semiconductor electronics devices 22 and diodes 24 can be interconnected within the power electronics assembly 20. An optional thermal stress relief layer 30 may be provided and disposed adjacent the insulating substrate 26.

A base metal structural component 32 may be provided, coupled to the thermal stress relief layer 30 (when present) or coupled directly to the insulating substrate 26. The base metal structural component 32 may be coupled to, or disposed adjacent to, a heat transfer device or heat sink, such as a cooling plate 34 that may be provided with a plurality of cooling structures, discussed in more detail below, that may be configured as fins, posts, micro-fins, and the like, disposed in strategic locations in order to assist in the ability of the base metal structural component 32 to transfer heat (via a cooling fluid passing over the fins) away from the semiconductor electronics device 22. A thermal paste/grease or thermal insulating material (not shown) is generally provided between the cooling plate 34 and the base metal structural component 32. In general, the base metal structural component 32 can include various metals known for their structural support and heat transfer functions. It is envisioned that at least a portion of the base metal structural component 32 can also include non-metal materials in addition to metal components, or portions/regions may be provided with a metal alloy or metal composite. In various aspects, aluminum, nickel, copper, copper-tungsten composite, AlSiC composite, and/or tin may be presently preferred materials for the base metal structural component 32 due to the combination of high strength, well-matched CTE, and good thermal transfer properties.

As illustrated, the assembly includes a frame component 36 that cooperates with the base metal structural component 32 to define an enclosure 38 containing the semiconductor electronics device 22, the insulating substrate 26, and any other components, such as the wiring 40, 42 bonded to respective terminals 44, 46 providing external connections.

Figure 2:
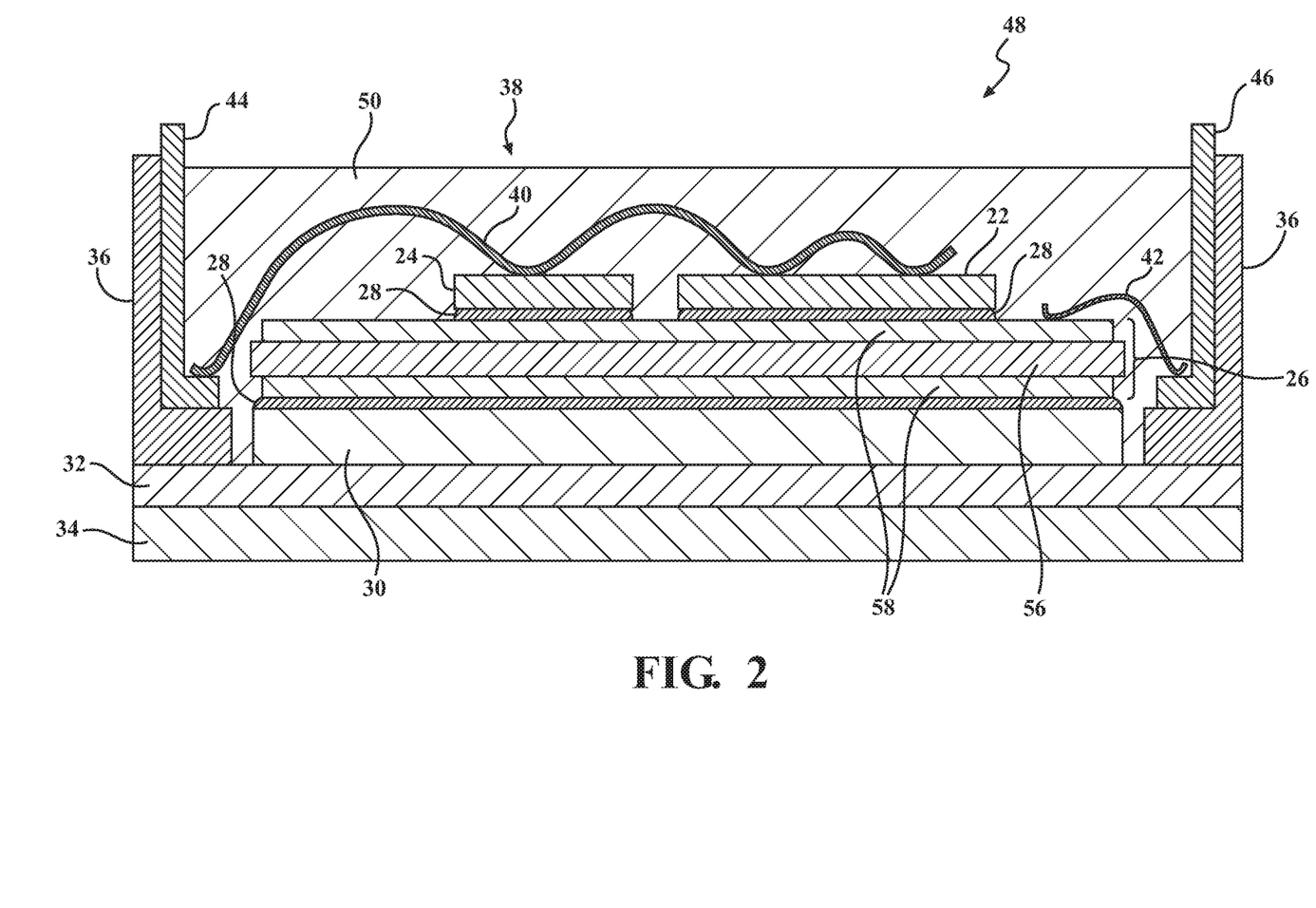
FIG. 2 is a schematic cross-sectional view of an exemplary power module including a semiconductor electronics device according to a first aspect of the present technology.

FIG. 2 is a schematic cross-sectional view of an exemplary power module 48 including a semiconductor electronics device 22 according to a first aspect of the present technology. Distinguished from the conventional power electronics module 20, the present technology provides a self-healing polymer 50 having disulfide bonds disposed within the enclosure 38 as a potting material. In various aspects, the self-healing polymer 50 may include polydimethylsiloxane based polyurethane (PDMS-PU) modified with disulfide bonds.

The present technology utilizes disulfide chemistry to introduce a self-healing feature useful with the dielectric insulating material. Self-healing of the insulating material can occur at moderate temperatures, such as room temperature, and can lead to a complete recovery of mechanical properties. In various aspects, disulfide groups may be introduced into a PDMS-PU network and are able to exchange and ultimately lead to a renewal of cross-links across damaged surfaces and areas. Disulfide bonds are dynamic covalent bonds that can be reversibly cleaved and formed under dynamic control such as oxido-reduction, thermal scission, and mechanical stress.

Figure 3:
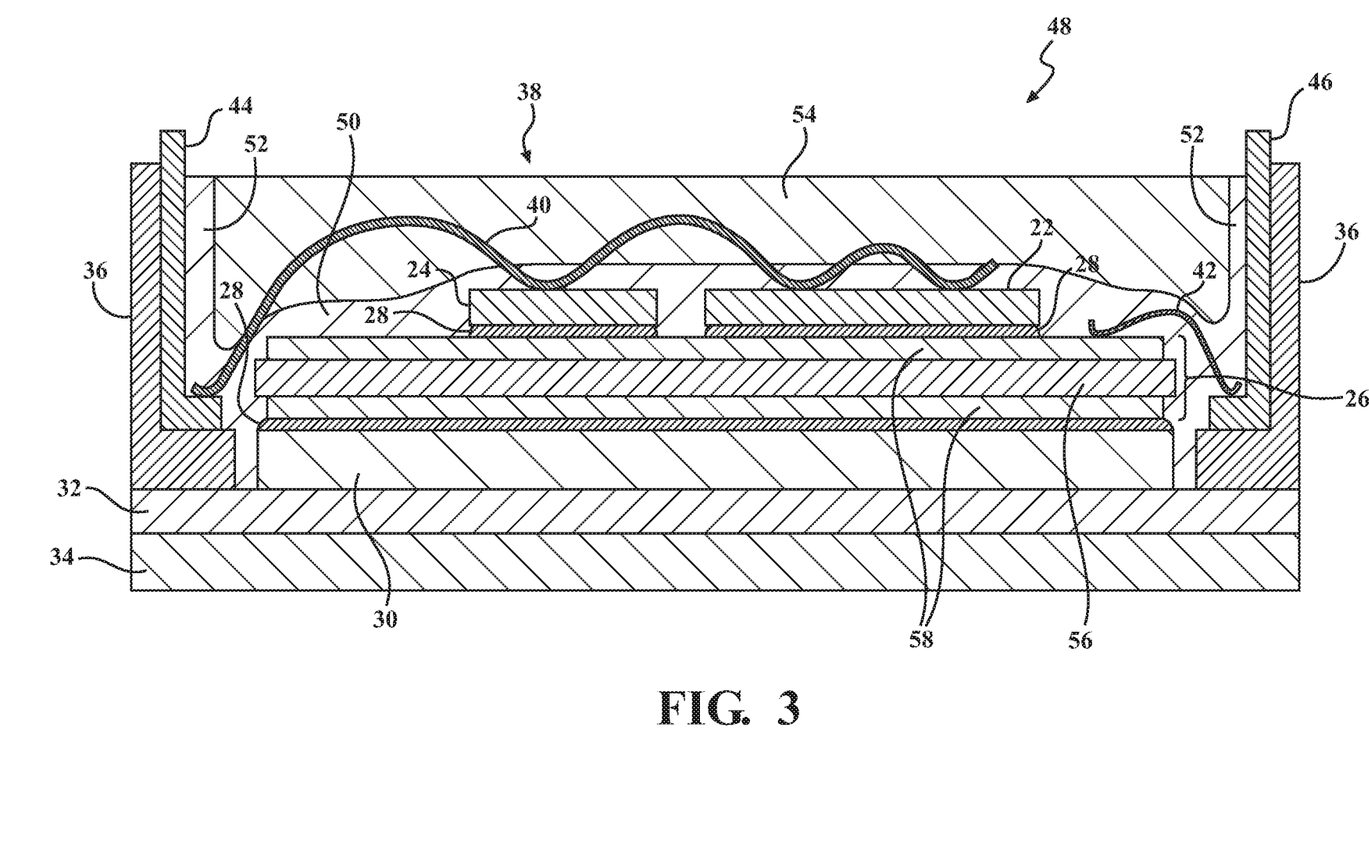
FIG. 3 is a schematic cross-sectional view of an exemplary power module including a semiconductor electronics device according to a second aspect of the present technology.

FIG. 3 is a schematic cross-sectional view of an exemplary power module 48 including a semiconductor electronics device 22 according to a second aspect of the present technology that includes additional potting material that may be provided as a multi-layered encapsulation. For example, a first layer of the self-healing polymer 50 may be provided in the enclosure to cover or encapsulate the semiconductor electronics device 22, diode 24, and the insulating substrate(s) 26. In various aspects, the self-healing polymer 50 may also be disposed in regions adjacent to the interior walls 52 of the frame component 36, as the edges of the enclosure or power device may be more prone to ESD. One or more additional potting material 54, having a composition simplified or different from the self-healing polymer 50, may be provided in the enclosure 38 and disposed as a layer over the self-healing polymer 50. In various aspects, the additional potting material may include a standard silicone gel or epoxy.

In various aspects, the insulating substrate 26 may include a ceramic substrate 56 with a laminated metal or layer of metal foil 58 disposed on the opposing major surfaces of the ceramic substrate 56. Non-limiting examples of the ceramic substrate 56 can include silicon nitride, aluminum nitride, and alumina. Non-limiting examples of the laminated metal or layer of metal foil 58 generally include aluminum and copper. As is known in the art, based on the metal used, the insulating substrate 26 may be referred to as direct bonded aluminum (DBA) substrate or a direct bonded copper (DBC) substrate. The upper laminated metal or layer of metal foil 58, adjacent the semiconductor electronics device 22, can be pre-formed or chemically etched to form an electrical circuit, while the lower laminated metal or layer of metal foil 58 may be selectively modified, as needed.

Figure 4:
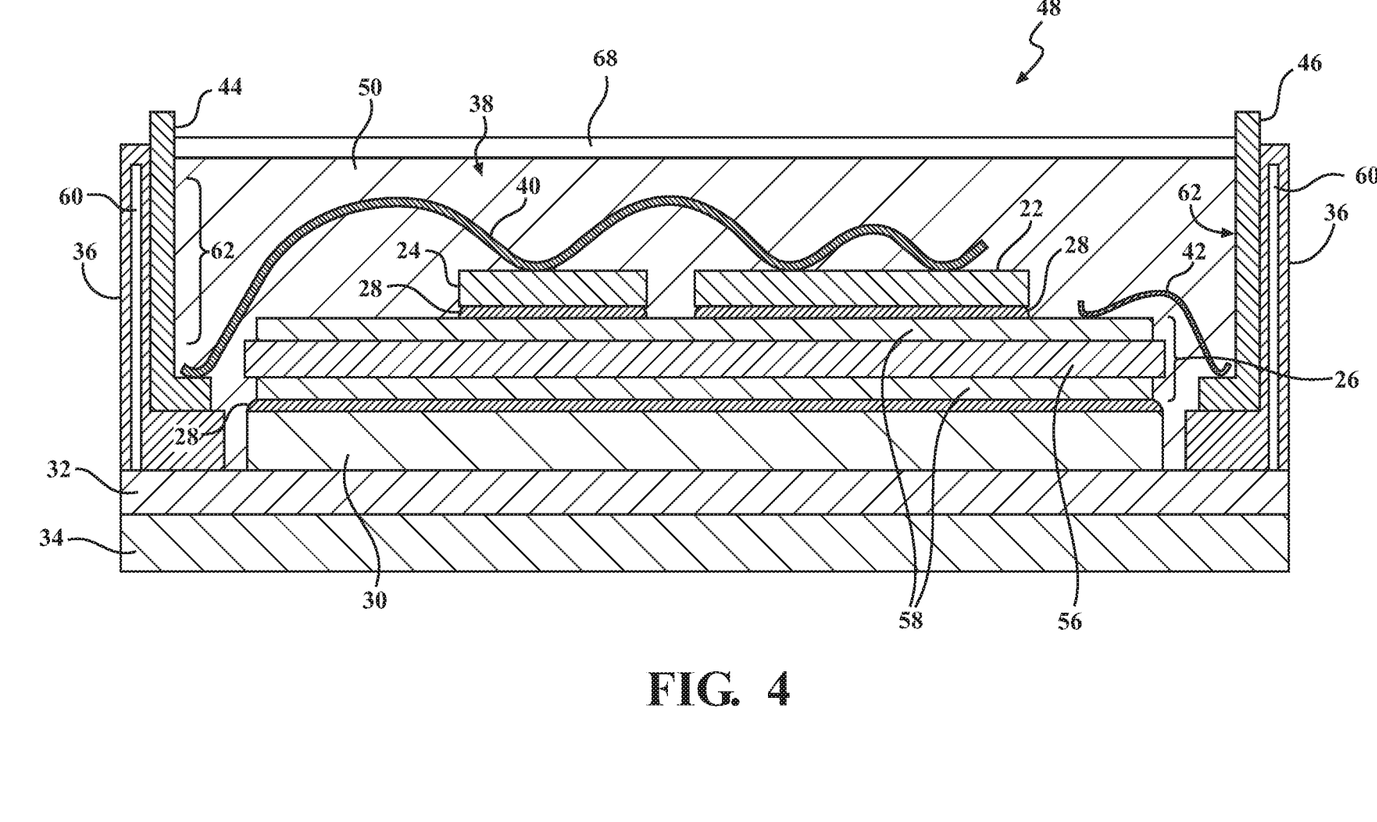
FIG. 4 is a schematic cross-sectional view of an exemplary power module including a semiconductor electronics device according to a third aspect of the present technology.

In various aspects, the present technology utilizes a self-healing polymer 50 with disulfide bonds in combination with directing waste heat from the heat generating semiconductor electronics device 22 to autonomously repair damage that may have occurred during the manufacturing process and/or due to ESD. In this regard, FIG. 4 is a schematic cross-sectional view of an exemplary power module 48 including a semiconductor electronics device 22. Here, the frame component 36 may be formed of a resin or thermoplastic with at least one high thermal conductivity heat transfer component 60 in thermal communication with one or more of the insulating substrate 26 and the base metal structural component 32. The heat transfer component 60 may be a high thermal conductivity copper or graphite/carbon insert embedded within the frame component 36 to generally increase the temperature of the frame 62 that surrounds the self-healing polymer 50. In such a way, the self-healing polymer may utilize a portion of the waste heat from the module transmitted through the base metal structural component 32 to the cooling plate 34.

Figure 5:
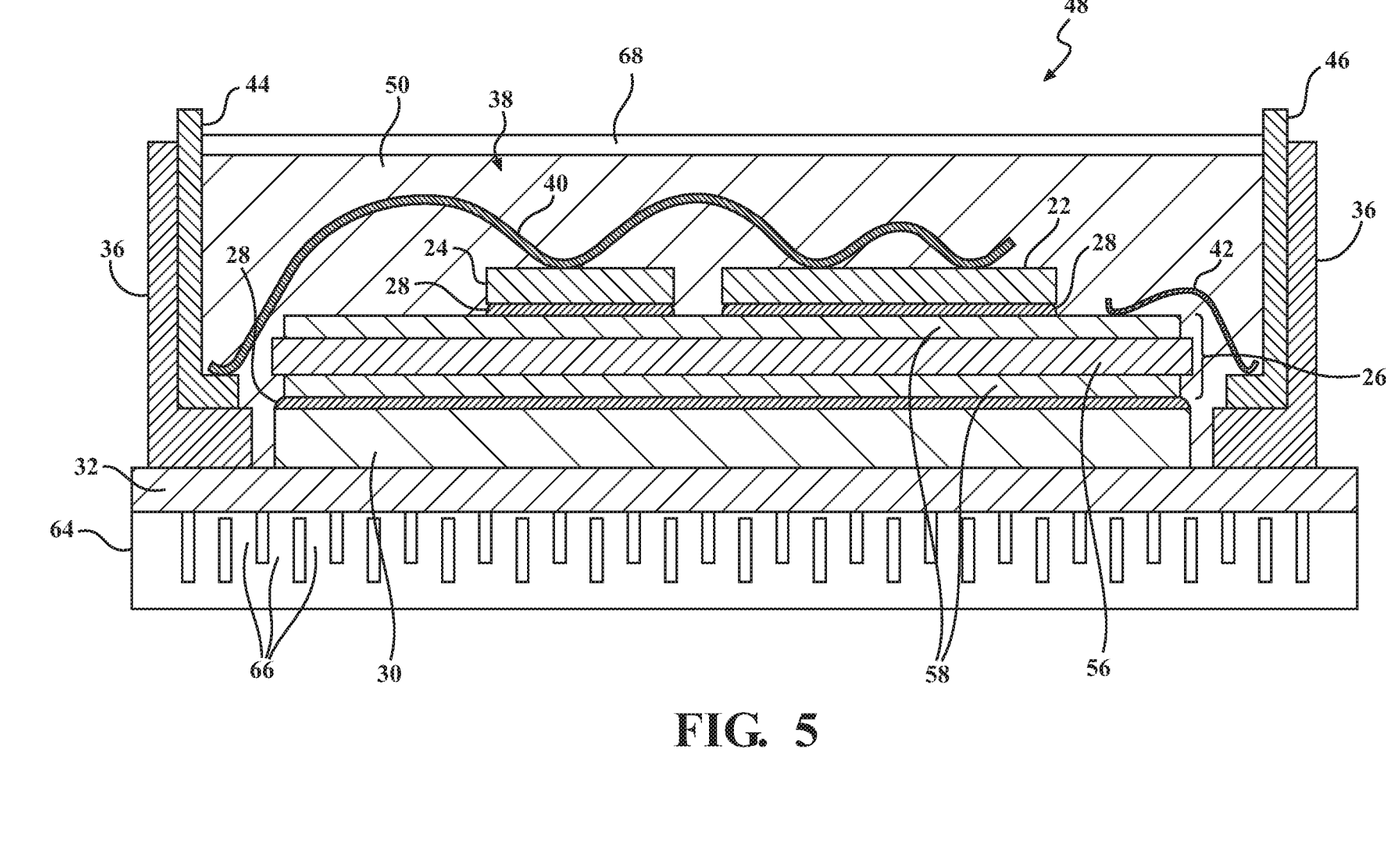
FIG. 5 is a schematic cross-sectional view of an exemplary power module including a semiconductor electronics device according to a fourth aspect of the present technology.

FIG. 5 is a schematic cross-sectional view of yet another exemplary power module 48 including a semiconductor electronics device 22 where the base metal structural component is disposed adjacent an exemplary heat sink provided as a cooling plate 64 with a plurality of cooling fins 66 that may be configured to define coolant passages for the flow of coolant in order to maximize heat transfer. Depending on the cooling plate design, the cooling system may provide for a flow of current that is either parallel to or normal to the cooling plate 64. In certain aspects, the cooling plate 64 can be coupled to the base metal structural component 32 and/or the frame component 36. In other aspects, the base metal structural component 32 can be integrated with the cooling plate 64 as a single component (not shown). While the heat sinks are generally cooled by liquid, there may also be designs that utilize air cooling. FIGS. 4-5 additionally show an optional cover plate 68 that can be used with any of the assemblies. The cover plate 68 may be thermally conductive and coupled to the heat transfer component 60 to transfer waste heat over a substantially larger portion of the self-healing polymer 50.

In addition to being useful with various electronics devices, components, and circuit boards, the present technology may be particularly useful with double-sided cooling of power modules. Power components have a maximum junction temperature, and heat dissipation to heat sinks may determine the maximum power dissipated by the device, which may influence the maximum current rating and the like. In certain aspects, double-sided cooling may result in 10-15% decrease in thermal resistance.

Figure 6:
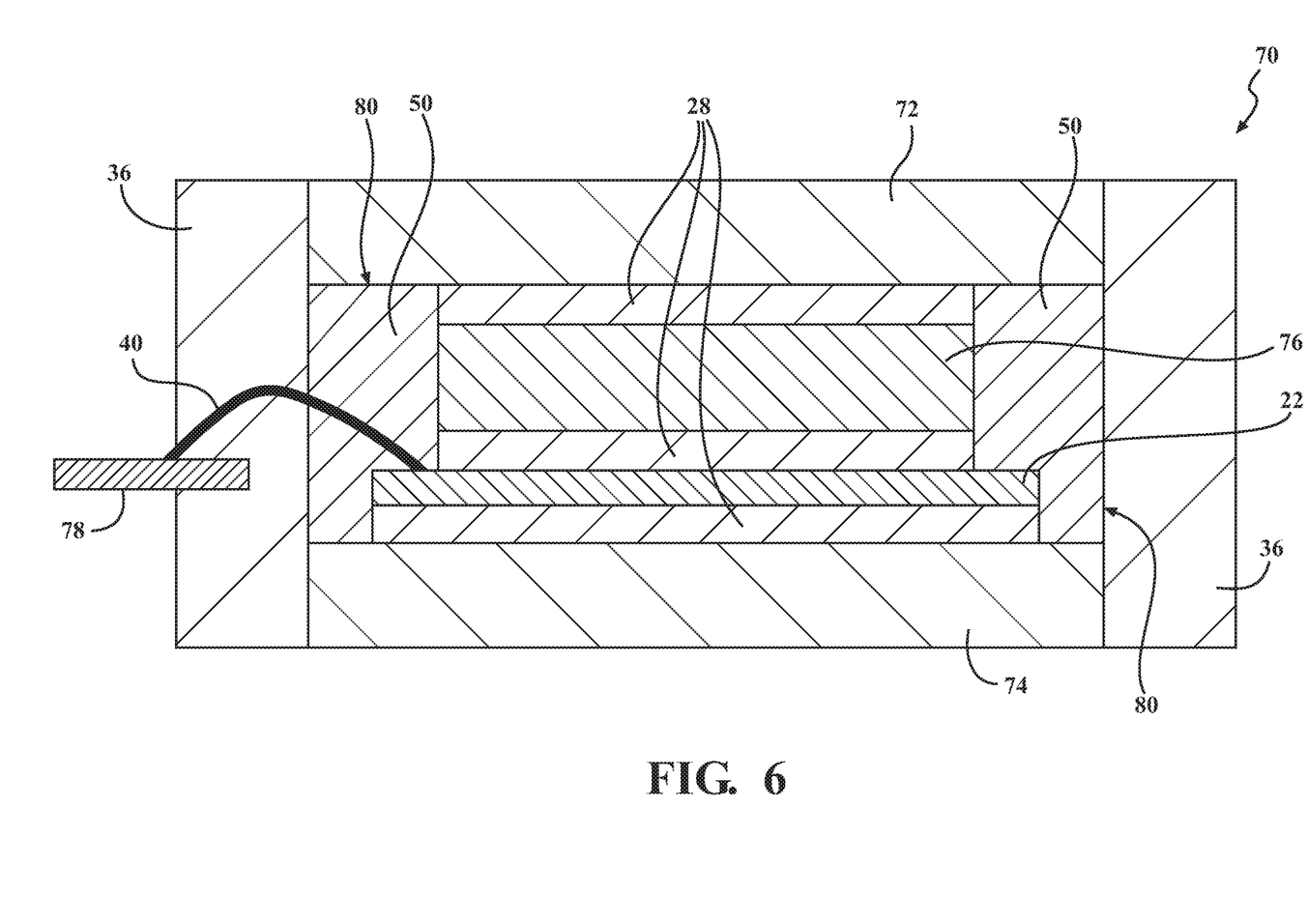
FIG. 6 is a schematic cross-sectional view of an exemplary power module shown with a semiconductor electronics device and a double-sided cooling feature according to a first aspect of the present technology.

FIG. 6 is a schematic view of an exemplary self-healing power module assembly 70 shown with a double-sided cooling feature according to various aspects of the present technology. The self-healing power module assembly 70 includes a semiconductor electronics device 22, such as an IGBT, that is sandwiched between solder 28, provided as bonding materials electrically connected to upper and lower electrodes 72, 74. The electrodes may be made of a metal such as copper. One or more optional copper spacer components 76 may also be provided. An upper electrode may be a component for an emitter, and the lower electrode may be a component for a collector. The components of the power electronics assembly 20 may be secured in place with a frame component 36 that may include a polymer resin for electrical isolation, and the assembly may include various wires 40 and external connections 78. The frame component 36 may cooperate with the upper and lower electrodes 72, 74 to define an enclosure 80 containing the semiconductor electronics device 22 and optional spacer component 76. A self-healing polymer 50 is provided disposed in the enclosure 80. In various aspects, the frame component 36 is configured to confine waste heat to edge regions of the enclosure 80 containing the semiconductor electronics device 22 that may be more prone to ESD.

Figure 7:
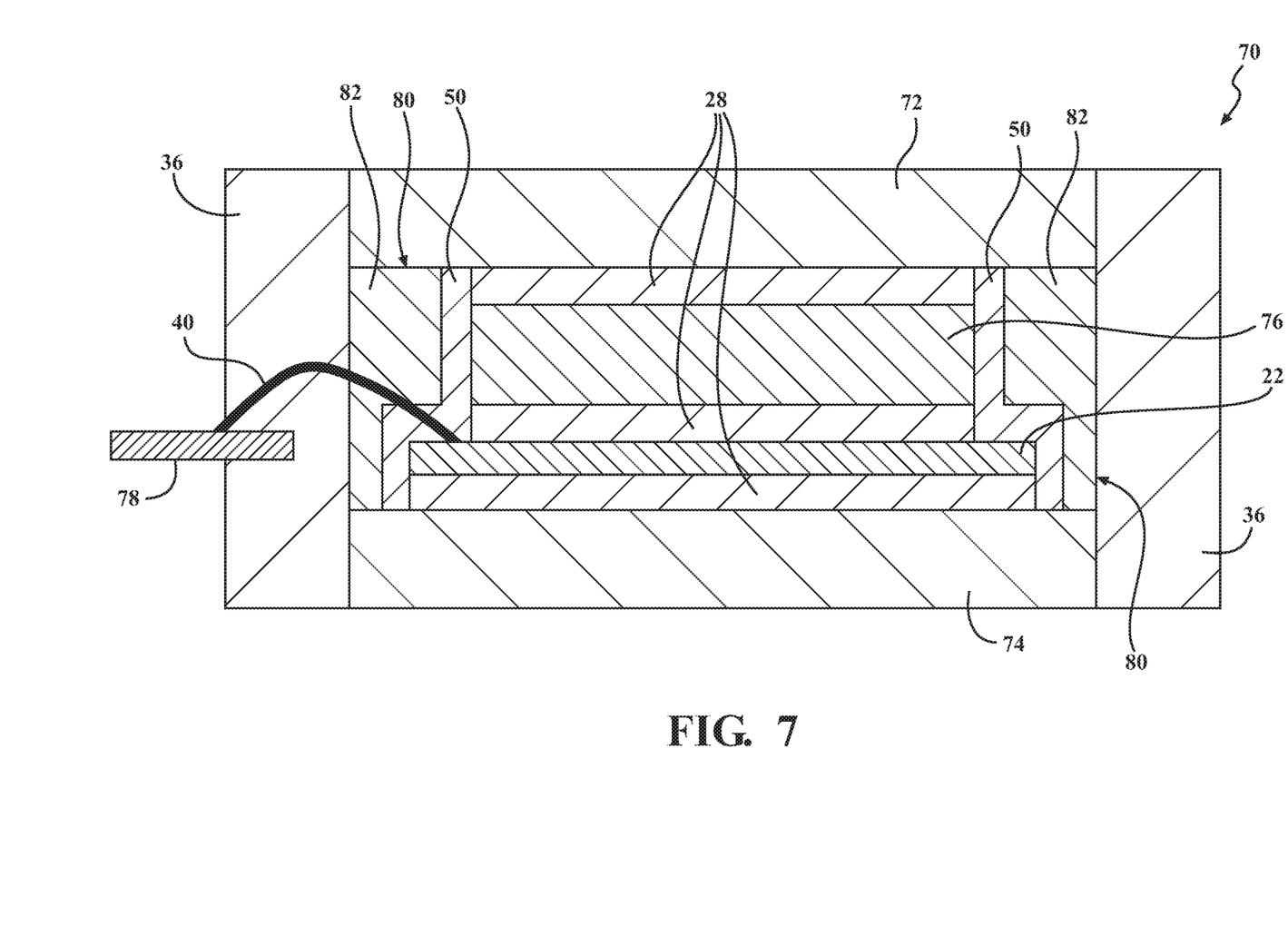
FIG. 7 is a schematic cross-sectional view of an exemplary power module shown with a semiconductor electronics device and a double-sided cooling feature according to a second aspect of the present technology.

FIG. 7 is a schematic view of another exemplary self-healing power module assembly 70 shown with a double-sided cooling feature similar to FIG. 6. In FIG. 7, however, additional potting material may be provided as a multi-layered encapsulation as described above with respect to FIG. 3. For example, a first layer of the self-healing polymer 50 may be provided in the enclosure to cover or encapsulate the semiconductor electronics device 22 and the spacer component 76. One or more additional potting material 82, having a composition more standard or different from the self-healing polymer 50, may be provided in the enclosure 80 and disposed as a layer over the self-healing polymer 50. In various aspects, the additional potting material 82 may include a common silicone gel or epoxy.

Figure 8:
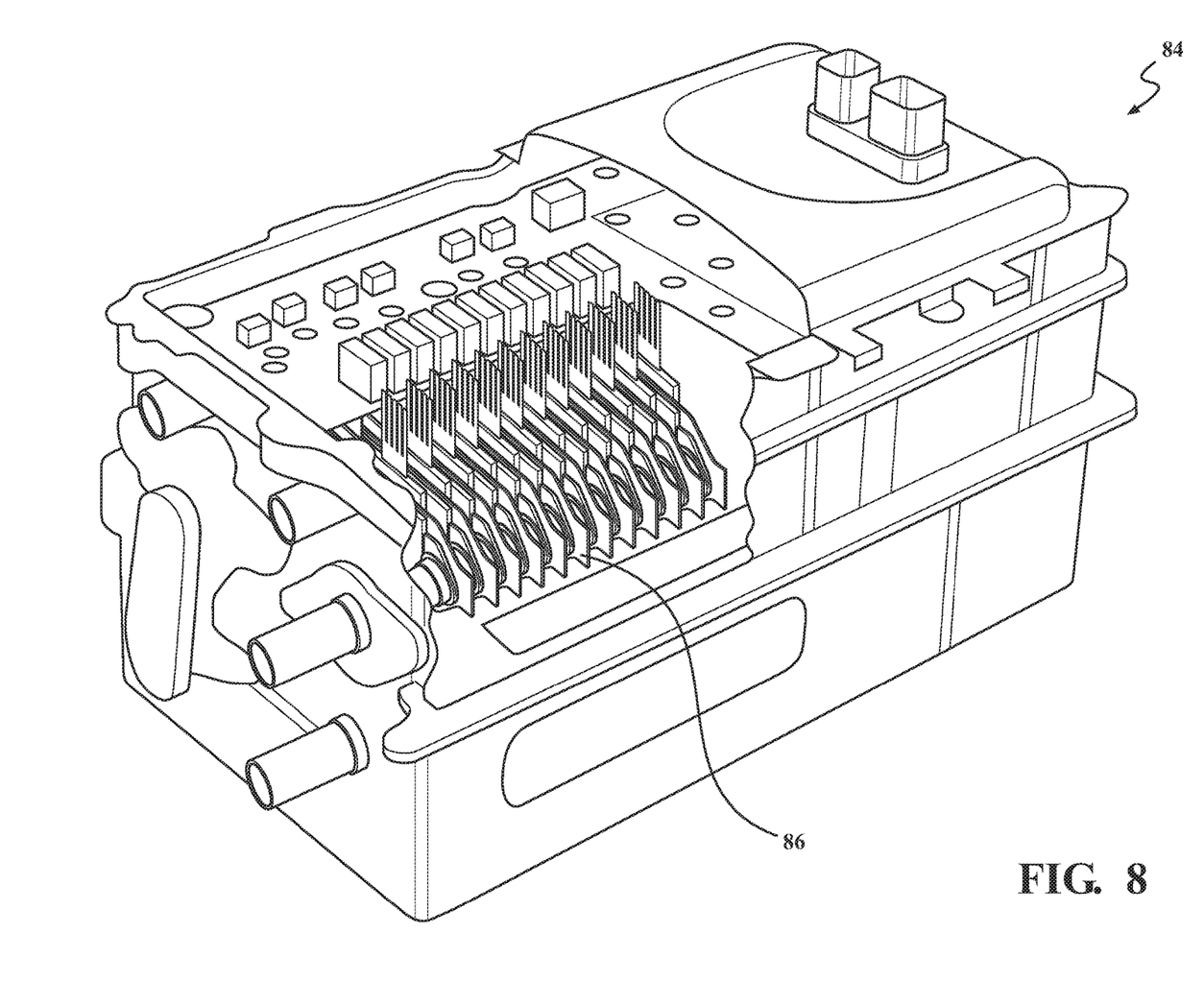
FIG. 8 is a perspective view of an exemplary power control unit (PCU) with the top portion exposed to illustrate the power stack with double sided cooler.
Figure 9:
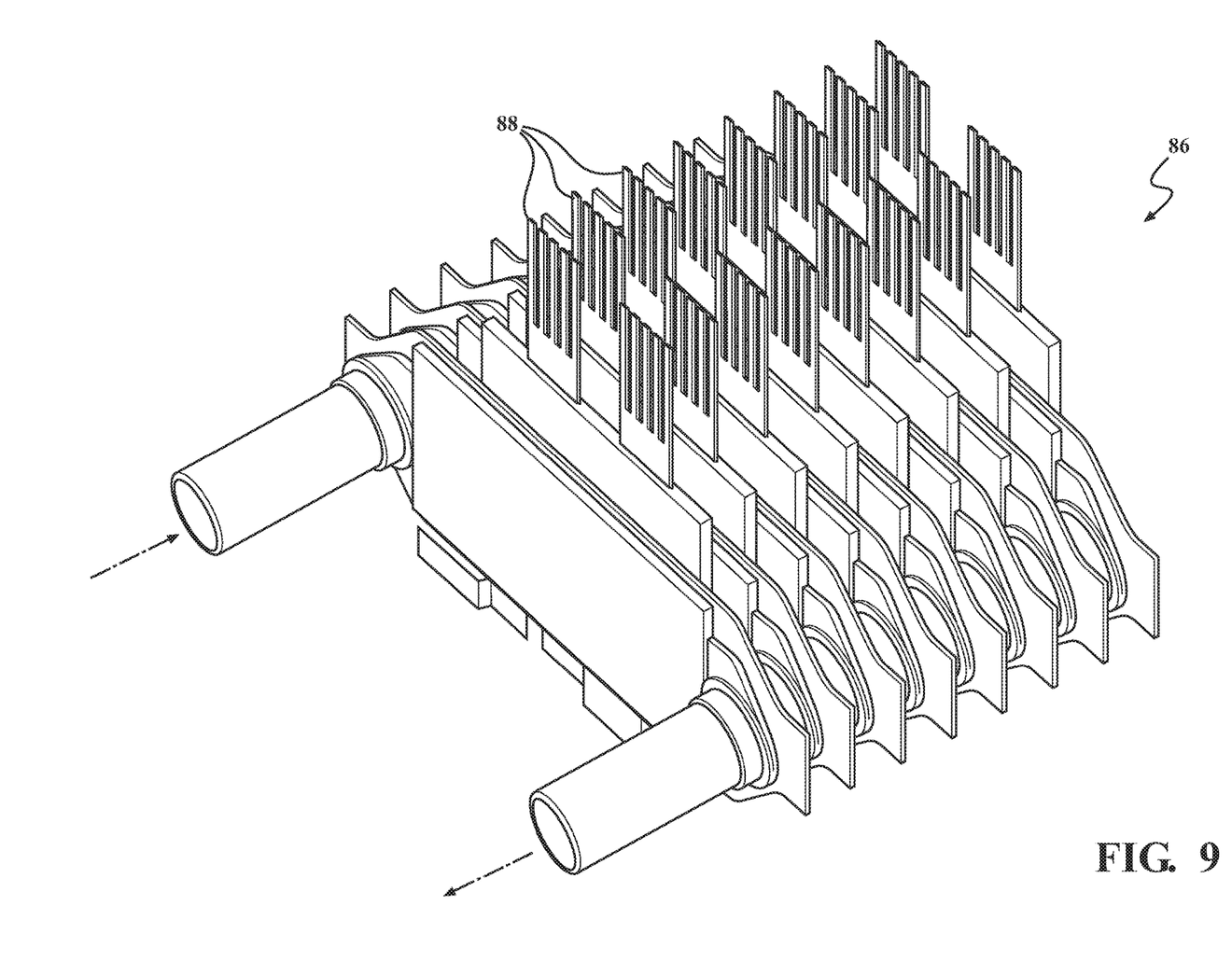
FIG. 9 is a perspective view of a portion of the power stack and double sided cooler from the PCU of FIG. 8.
Figure 10:
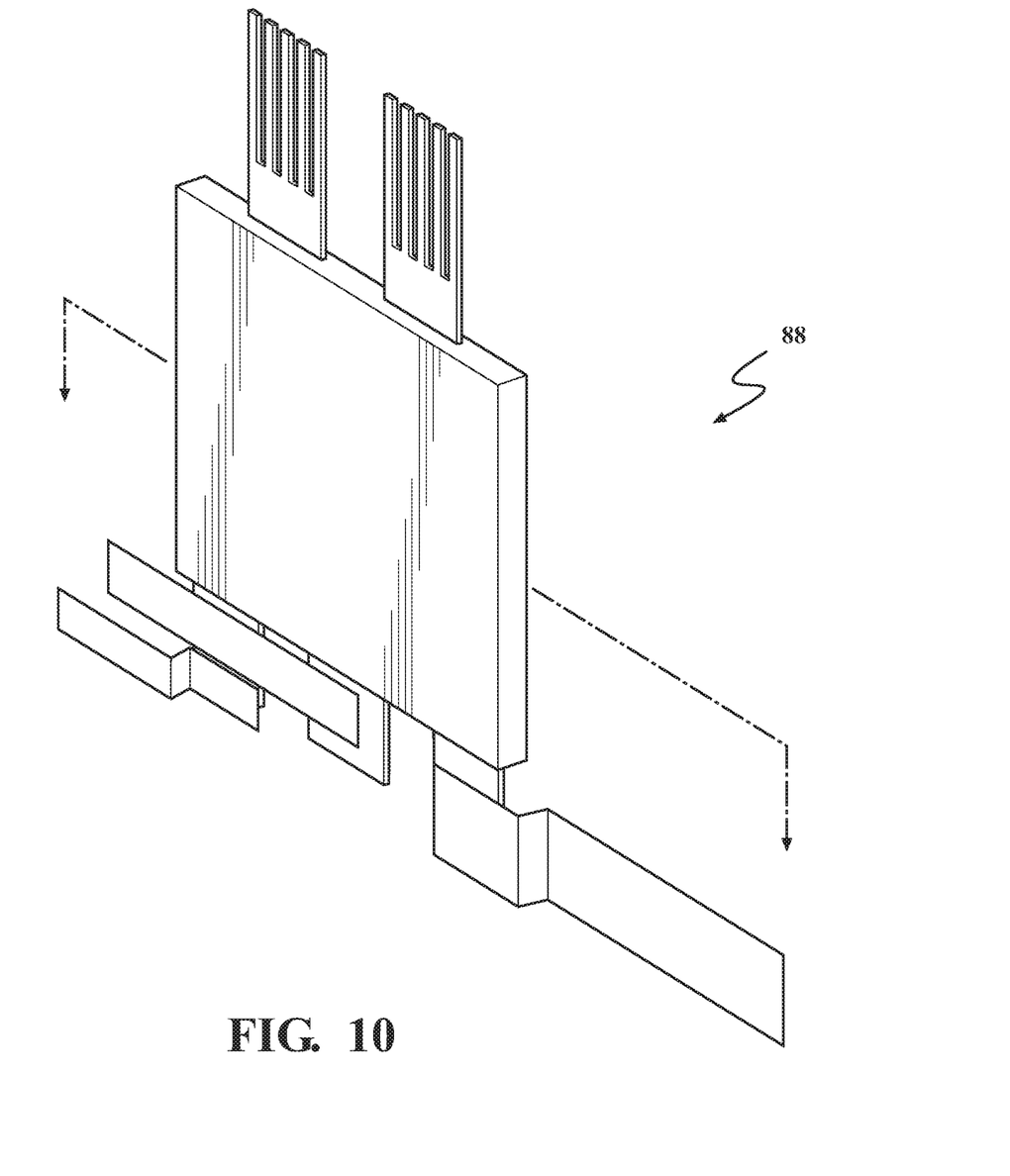
FIG. 10 is a perspective view of an exemplary power card from the power stack of FIGS. 8 and 9.

Environmentally-friendly vehicles such as hybrid, electric, and fuel cell vehicles commonly use power control units (PCUs) to convert alternating current (AC) to direct current (DC), and vice-versa. FIG. 8 illustrates an exemplary PCU 84 that may include a power stack 86. As shown in FIG. 9, the power stack 86 may utilize a double sided cooler with a plurality of power cards 88 disposed therein. The present technology additionally contemplates the use and placement of the self-healing polymer 50 with disulfide bonds within power cards 88 having a semiconductor electronics device 22 to provide a self-healing power card. FIGS. 6-7, discussed above, provide exemplary cross-sectional views of the power card 88 of FIG. 10. In various aspects, the power card 88 may include an external shell encapsulating the self-healing polymer, the external shell including one of an epoxy and a resin. Or there may be a silicone gel encapsulating the self-healing polymer, where the external shell encapsulates the silicone gel.

The foregoing description is provided for purposes of illustration and description and is in no way intended to limit the disclosure, its application, or uses. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations should not be regarded as a departure from the disclosure, and all such modifications are intended to be included within the scope of the disclosure.

As used herein, the phrase at least one of A, B, and C should be construed to mean a logical (A or B or C), using a non-exclusive logical "or." It should be understood that the various steps within a method may be executed in different order without altering the principles of the present disclosure. Disclosure of ranges includes disclosure of all ranges and subdivided ranges within the entire range, including the endpoints.

The headings (such as "Background" and "Summary") and sub-headings used herein are intended only for general organization of topics within the present disclosure, and are not intended to limit the disclosure of the technology or any aspect thereof. The recitation of multiple embodiments having stated features is not intended to exclude other embodiments having additional features, or other embodiments incorporating different combinations of the stated features.

As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that an embodiment can or may comprise certain elements or features does not exclude other embodiments of the present technology that do not contain those elements or features.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one aspect, or various aspects means that a particular feature, structure, or characteristic described in connection with an embodiment or particular system is included in at least one embodiment or aspect. The appearances of the phrase "in one aspect" (or variations thereof) are not necessarily referring to the same aspect or embodiment. It should be also understood that the various method steps discussed herein do not have to be carried out in the same order as depicted, and not each method step is required in each aspect or embodiment.

What is claimed is:

1. A power electronics assembly with a self-healing feature, the power electronics assembly comprising:
    a semiconductor electronics device;
    an insulating substrate coupled to the semiconductor electronics device;
    a base metal structural component coupled to the insulating substrate;
    a frame component cooperating with the base metal structural component and including interior walls defining an enclosure containing the semiconductor electronics device and the insulating substrate;
    a first layer of a self-healing polymer comprising disulfide bonds, the self-healing polymer disposed within the enclosure to encapsulate the semiconductor electronics device and the insulating substrate, and disposed adjacent the interior walls; and
    a second layer of a potting material, different from the self-healing polymer, disposed over the self-healing polymer,
    wherein the interior walls of the frame component are configured to confine waste heat to edge regions of the semiconductor electronics device.

2. The power electronics assembly according to claim 1, wherein the self-healing polymer comprises polydimethylsiloxane based polyurethane (PDMS-PU) modified with disulfide bonds.

3. The power electronics assembly according to claim 1, wherein the potting material comprises one of an epoxy and a silicone gel.

4. The power electronics assembly according to claim 1, wherein the frame component is configured to direct waste heat to the self-healing polymer.

5. The power electronics assembly according to claim 4, wherein the frame component comprises a resin with at least one heat transfer component embedded within the frame component and in direct thermal communication with the base metal structural component.

6. The power electronics assembly according to claim 5, wherein the base metal structural component comprises at least one of nickel, copper, and tin.

7. The power electronics assembly according to claim 1, further comprising a heat sink coupled to the base metal structural component.

8. The power electronics assembly according to claim 1, wherein the insulating substrate comprises one of a direct bonded copper (DBC) substrate and a direct bonded aluminum (DBA) substrate, and the semiconductor electronics device comprises one of an integrated gate bipolar transistor (IGBT) and a metal-oxide semiconductor field-effect transistor (MOFSET).

9. A self-healing power module assembly with double sided cooling, the self-healing power module assembly comprising:
 a lower electrode;
 a semiconductor electronics device coupled to the lower electrode;
 a spacer component adjacent the semiconductor electronics device;
 an upper electrode disposed adjacent to the spacer component;
 a frame component cooperating with the upper electrode and the lower electrode to define an enclosure containing the semiconductor electronics device and the spacer component, the frame component comprising a resin with at least one heat transfer component embedded within the frame component and in direct thermal communication with one of the upper and lower electrodes, such that the frame component is configured to confine waste heat to edge regions of the semiconductor electronics device; and
 a self-healing polymer comprising disulfide bonds, the self-healing polymer disposed within the enclosure.

10. The self-healing power module assembly according to claim 9, wherein the self-healing polymer comprises polydimethylsiloxane based polyurethane (PDMS-PU) modified with disulfide bonds.

11. The self-healing power module assembly according to claim 9, wherein the upper electrode and the lower comprise copper, and the semiconductor electronics device comprises one of an integrated gate bipolar transistor (IGBT) and a metal-oxide semiconductor field-effect transistor (MOFSET).

12. A power electronics assembly with a self-healing feature, the power electronics assembly comprising:
 a semiconductor electronics device;
 an insulating substrate coupled to the semiconductor electronics device;
 a base metal structural component coupled to the insulating substrate;
 a frame component cooperating with the base metal structural component and including interior walls defining an enclosure containing the semiconductor electronics device and the insulating substrate;
 at least one heat transfer component embedded within the frame component and to in direct thermal communication with the base metal structural component to increase a temperature of the frame component;
 at least one terminal providing an external connection; and
 a self-healing polymer comprising disulfide bonds, the self-healing polymer disposed within the enclosure and adjacent the interior walls, wherein the interior walls of the frame component are configured to confine waste heat to edge regions of the semiconductor electronics device.

* * * * *